(12) United States Patent
Chudzik et al.

(10) Patent No.: US 9,099,461 B2
(45) Date of Patent: Aug. 4, 2015

(54) METHOD OF MANUFACTURING SCALED EQUIVALENT OXIDE THICKNESS GATE STACKS IN SEMICONDUCTOR DEVICES AND RELATED DESIGN STRUCTURE

(75) Inventors: Michael P. Chudzik, Ridgefield, CT (US); Min Dai, Mahwah, NJ (US); Jinping Liu, Hopewell Junction, NY (US); Paul A. Ronsheim, Barneveld, WI (US); Joseph F. Shepard, Jr., Poughkeepsie, NY (US); Shahab Siddiqui, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 584 days.

(21) Appl. No.: 13/490,740

(22) Filed: Jun. 7, 2012

(65) Prior Publication Data

US 2013/0330843 A1    Dec. 12, 2013

(51) Int. Cl.
*H01L 21/66* (2006.01)
*H01L 29/51* (2006.01)
*H01L 21/28* (2006.01)

(52) U.S. Cl.
CPC ........ *H01L 29/513* (2013.01); *H01L 21/28185* (2013.01); *H01L 21/28202* (2013.01); *H01L 22/12* (2013.01); *H01L 22/26* (2013.01); *H01L 29/518* (2013.01); *H01L 2924/0002* (2013.01)

(58) Field of Classification Search
None
See application file for complete search history.

(56) References Cited

U.S. PATENT DOCUMENTS

| 6,638,876 B2 | 10/2003 | Levy et al. |
| 7,033,894 B1 | 4/2006 | Zhong et al. |
| 7,563,729 B2 | 7/2009 | Xiao et al. |
| 2003/0057432 A1 | 3/2003 | Gardner et al. |
| 2005/0070120 A1 | 3/2005 | Barnett et al. |
| 2005/0124121 A1 | 6/2005 | Rotondaro et al. |
| 2010/0090294 A1 | 4/2010 | Narwankar et al. |

FOREIGN PATENT DOCUMENTS

SG     141224 A1    4/2008

OTHER PUBLICATIONS

Onsishi et al., "Improvement of Surface Carrier Mobility of HfO2 MOSFETs by High-Temperature Forming Gas Annealing," Feb. 2003, pp. 384-390, vol. 50, IEEE Transactions on Electron Devices.
Pending Application, U.S. Appl. No. 13/098,840, Filed May 2, 2011, Entitled "Semiconductor Device Devoid of an Interfacial Layer and Methods of Manufacture," FIS920110005US1.

*Primary Examiner* — Seahvosh Nikmanesh
(74) *Attorney, Agent, or Firm* — Yuanmin Cai; Hoffman Warnick LLC

(57) ABSTRACT

A method of forming a semiconductor device is disclosed. The method includes: forming a dielectric region on a substrate; annealing the dielectric region in an environment including ammonia ($NH_3$); monitoring a nitrogen peak of at least one of the substrate and the dielectric region during the annealing; and adjusting a parameter of the environment based on the monitoring of the nitrogen peak.

15 Claims, 9 Drawing Sheets

METHOD OF MANUFACTURING SCALED EQUIVALENT OXIDE THICKNESS GATE STACKS IN SEMICONDUCTOR DEVICES AND RELATED DESIGN STRUCTURE

TECHNICAL FIELD

Embodiments of this disclosure relate generally to semiconductor devices and, more particularly, to a semiconductor device including a scaled equivalent oxide thickness (EOT) gate stack, a related method and design structure.

BACKGROUND

In semiconductor devices, nitridation of components and materials (e.g., gate stacks) is frequently included as a part of the manufacturing process to decrease device size and increase device performance. The application and control of the nitridation process introduces nitrogen into semiconductor device materials (e.g., dielectric region, interfacial region, etc.) and impacts device performance, leakage, EOT, and the semiconductor device profile. In some systems, nitridation is performed via plasma nitridation and annealing. In these systems, during plasma nitridation the semiconductor device is exposed to a high temperature environment including a plurality of ionized gas molecules (e.g., nitrogen) which diffuse into the device. Following the plasma nitridation, the semiconductor device is then annealed to complete the nitridation process. However, this high temperature, two-step method may complicate the build process and increase costs and variability, requiring stabilization and the use of multiple dummies during the manufacturing process. Further, this two-step method relies upon off-line calculations and pre-determined conditions (e.g., annealing temperature, annealing pressure, etc.) which may deprive manufacturers of the ability to dynamically scale the EOT of gate stacks in the semiconductor device by controlling nitridation concentrations in real-time during the annealing process.

BRIEF SUMMARY

A first aspect of the disclosure provides a method including: forming a dielectric region on a substrate; annealing the dielectric region in an environment including ammonia ($NH_3$); monitoring a nitrogen peak of at least one of the substrate and the dielectric region during the annealing; and adjusting a parameter of the environment based on the monitoring of the nitrogen peak.

A second aspect of the disclosure provides a design structure embodied in a machine-readable storage medium for design, manufacturing, or testing, the design structure comprising text or a graphical representation of: a substrate; and a high-K dielectric region disposed on the substrate, the high-K dielectric region having an Nitrogen (N) depth profile developed by baking the high-K dielectric in an environment including $NH_3$.

A third aspect of the disclosure provides a method of forming a semiconductor device, the method including: baking a substrate and a high-K dielectric region in an environment including $NH_3$; monitoring a Nitrogen profile in at least one of the substrate and the high-K dielectric during the baking; and adjusting an environmental condition of the annealing process based on the monitoring of the N profile.

These and other aspects, advantages and salient features of the invention will become apparent from the following detailed description, which, when taken in conjunction with the annexed drawings, where like parts are designated by like reference characters throughout the drawings, disclose embodiments of the invention.

BRIEF DESCRIPTION OF THE DRAWINGS

The above and other aspects, features and advantages of the invention will be better understood by reading the following more particular description of the invention in conjunction with the accompanying drawings.

Figure 1:
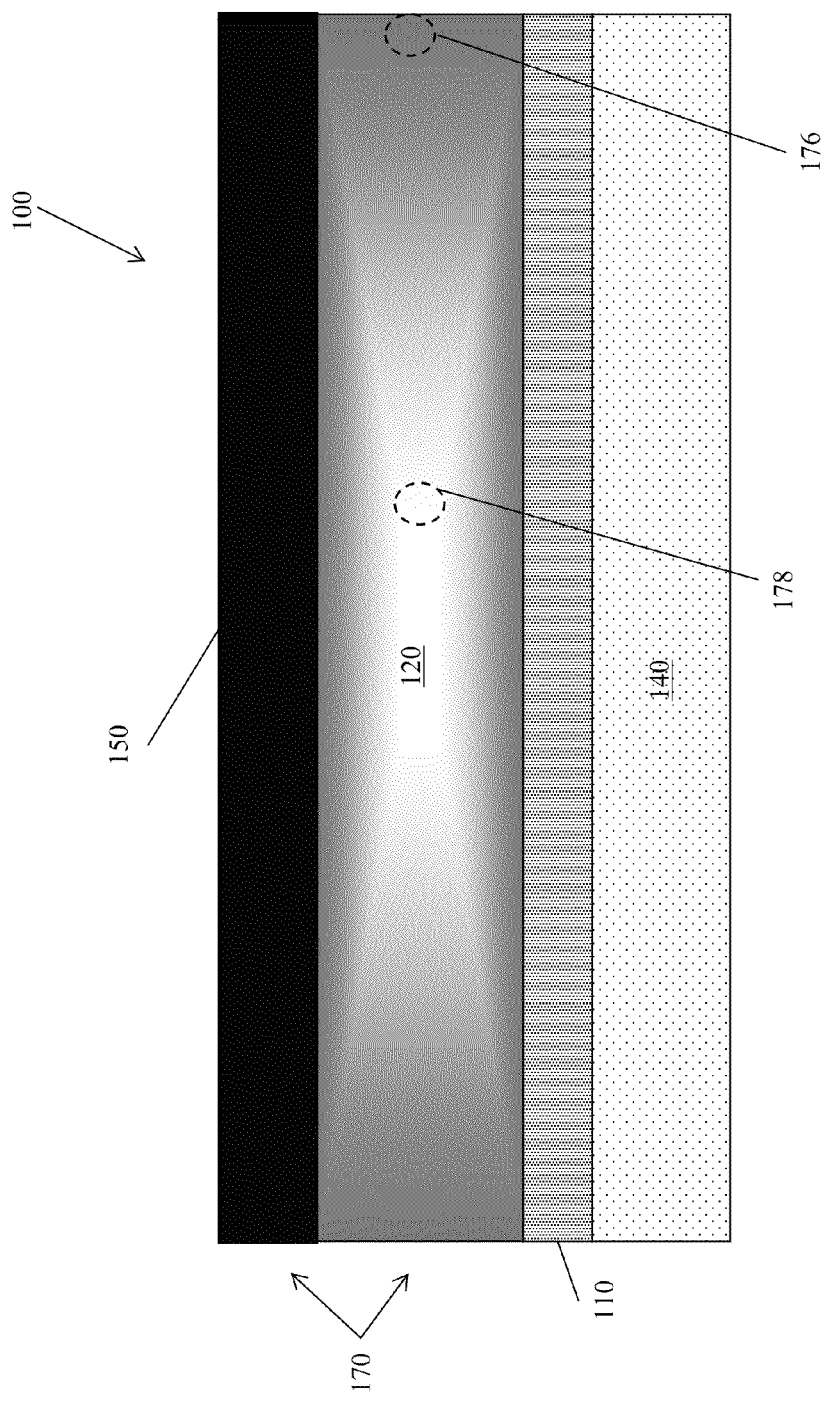
FIG. 1 is a demonstrative illustration of a portion of a semiconductor device according to an embodiment of the invention.
Figure 2:
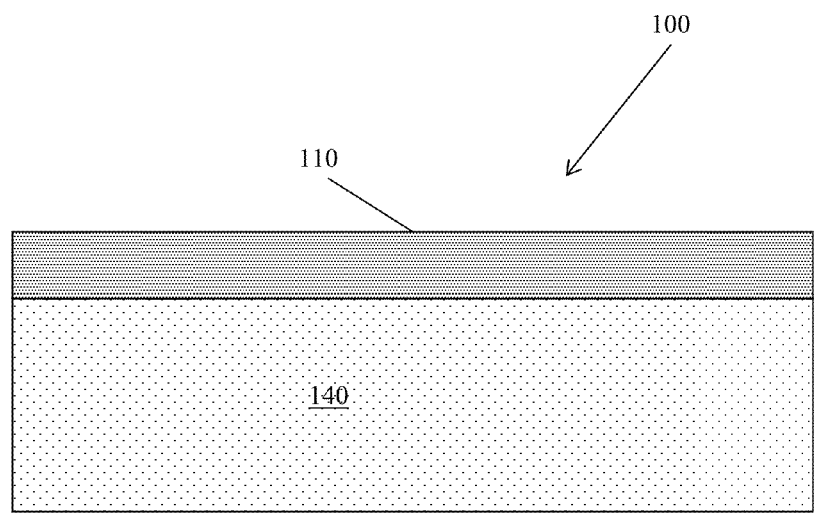
FIGS. 2-7 are demonstrative illustrations of a method of forming a semiconductor device according to embodiments of the invention.

It is noted that the demonstrative illustrations of the disclosure are not necessarily to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION

FIG. 1 is a demonstrative illustration of a cross sectional view of a portion of a semiconductor device 100 according to embodiments of the invention. Semiconductor device 100 may include a substrate 140 with an interfacial region 110 formed thereon. It is understood that the use of interfacial region 110 in this embodiment is merely exemplary, and that any form of region and/or material (e.g., substrate, isolation region, oxygen, etc.) may form or comprise interfacial region 110 including materials and/or regions through which oxygen may diffuse. In one embodiment, interfacial region 110 may include an ultra-thin (e.g., less than about 20 millimeters) high dielectric constant (high-K) region (e.g., a region with a high degree of permittivity relative other materials in semiconductor device 100) on substrate 140. Semiconductor device 100 may also include a dielectric region 120 disposed between portions of interfacial region 110 and an electrode region 150, forming a gate 170. In one embodiment, dielectric region 120 may have a thickness of less than about 30 angstroms.

A material profile of dielectric region 120 may be varied (e.g., consisting of different concentrations of different materials) between interfacial region 110 and electrode region 150. In one embodiment, nitrogen (N) may be introduced into portions of dielectric region 120 via an $NH_3$ annealing process, thereby adjusting the material profile of dielectric region 120. As a result of the $NH_3$ annealing process, different portions and/or regions of dielectric region 120 may have varying amounts of nitrogen concentration (e.g., a first portion 176 (shown in phantom) of dielectric region 120 proximate an extremity of semiconductor device 100, may have a high concentration of nitrogen relative a second portion 178 (shown in phantom) of dielectric region 120 proximate a central point of dielectric region 120). This variance in the material profile of dielectric region 120 may be linear (e.g., natural, gradual or incremental), exponential (e.g., irregular or varying), or any other form of gradation or variation known. The presence or introduction of nitrogen into any of dielectric region 120 and interfacial region 110 may impact performance of gate 170 by effecting the scaled EOT of dielectric region 120. In one embodiment, technicians may manipulate the material profile of dielectric region 120 by regulating and adjusting nitrogen introduction via the processes described herein, thereby scaling the EOT.

In one embodiment, the material profile of dielectric region 120 may be formed by performing a thermal anneal 180 (shown in FIG. 4) in an environment including ammonia ($NH_3$). The time period for thermal anneal 180 may be set or adjustable as is required, the technicians adjusting the time period to control the introduction of nitrogen and the material profile of dielectric region 120. Thermal anneal 180 may be performed in an ammonia rich environment (e.g., an environment with a chemical composition which includes greater than about 50% ammonia). This $NH_3$ rich thermal anneal 180 may be performed with low pressure (e.g., less than about 20 torr) at about ambient conditions. In one embodiment, $NH_3$ rich thermal anneal 180 may be performed at a pressure of less than about 10 torr. The scaled Equivalent Oxide Thickness (EOT) of dielectric region 120 and/or interfacial region 110 may be controlled by monitoring the material profile of dielectric region 120 during thermal anneal 180, and manipulating parameters (e.g., environmental composition, $NH_3$ concentration, temperature, pressure, etc.) of thermal anneal 180. In one embodiment, the material concentration profile of dielectric region 120 may be controlled or dynamically adjusted during thermal anneal 180 by adjusting the environmental pressure and/or the nitrogen concentration in the environment about dielectric region 120 and/or substrate 140. In one embodiment, the concentration of $NH_3$ about dielectric region 120 during annealing process 180 may be controlled by either or both of the introduction of $NH_3$ into the environment or the introduction of an inert gas (e.g., $N_2$, Ar, etc.) into the environment. During cooling of substrate 140 and dielectric region 120 the environment about substrate 140 and dielectric region 120 may include an inert gas (e.g., $N_2$, Ar, etc.).

Any number of dielectric regions may be located over the IC/chip body, as many other regions included in semiconductor chips as are now known or later developed. In one embodiment, dielectric region 120 may include silicon dioxide ($SiO_2$) for its insulating, mechanical and optical qualities. Dielectric region 120 may include any commonly used gate dielectric material including but not limited to oxide, nitride, oxynitride, and high-k materials such as hafnium silicate, zirconium silicate, hafnium dioxide, zirconium dioxide, silicon nitride ($Si_3N_4$), fluorinated $SiO_2$ (FSG), hydrogenated silicon oxycarbide (SiCOH), porous SiCOH, boro-phosho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or regions thereof. In one embodiment, dielectric region 120 may include silicon dioxide ($SiO_2$), silicon nitride (SiN), or any other suitable material. Dielectric region 120 may be deposited using conventional techniques described herein and/or those known in the art. It is understood that while specific material examples for dielectric region 120 are described herein, dielectric region 120 may include any now known or later developed materials which provide the features described herein.

Substrate 140 can comprise any commonly used substrate material including but not limited to silicon, germanium, silicon germanium, silicon carbide, and those consisting essentially of one or more Group III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Substrate 140 may also be comprised of Group II-VI compound semiconductors having a composition $Zn_{A1}Cd_{A1}Se_{B1}Te_{B2}$, where A1, A2, B1, and B2 are relative proportions each greater than or equal to zero and A1+A2+B1+B2=1 (1 being a total mole quantity). The processes to provide substrate 140, as illustrated and described, are well known in the art and thus, no further description is necessary. Further, gate 170 can comprise any commonly used gate material including but not limited to polysilicon or high melting point refractory metals, such as W, Ti, Ta, Mo, Nb, Re, Ru and their binary or ternary metallic derivatives, e.g. WN, TiN, TaN, MoN, MoO2, TaSiN.

FIGS. 2-7 are demonstrative illustrations of a device undergoing processes in a method according to embodiments. Although FIGS. 2-7 show the method of forming portions of semiconductor device 100 in FIG. 1, it is understood that a similar method may be employed to form any other like semiconductor device and that any other processes and features may be included as a part of the build process.

Figure 3:
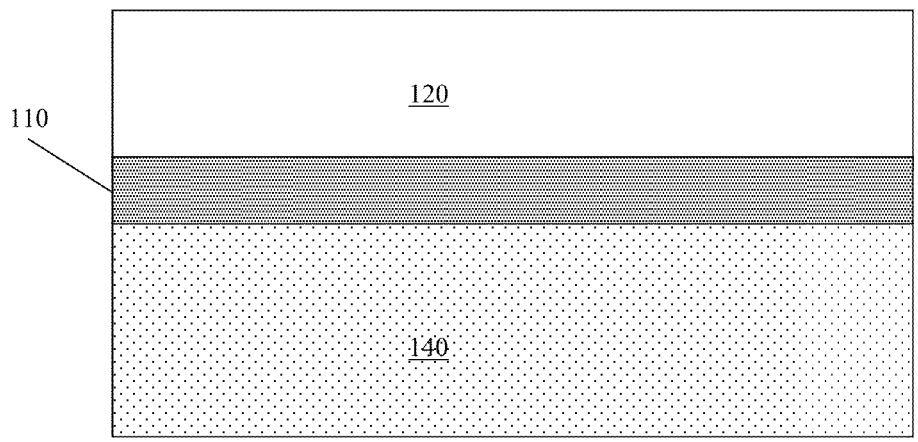

Returning to FIG. 2, a demonstrative illustration of a cross-sectional view of semiconductor device 100 undergoing a process according to embodiments is shown. In this embodiment, semiconductor device 100 has an interfacial region 110 formed on substrate 140. Interfacial region 110 may include nitride or any other material commonly known. In one embodiment, interfacial region 110 may be deposited on substrate 140. As used herein, the term "depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser-assisted deposition, thermal oxidation, thermal nitridation, spin-on methods, physical vapor deposition (PVD), atomic layer deposition (ALD), chemical oxidation, molecular beam epitaxy (MBE), plating, evaporation, etc. FIG. 3 is a demonstrative illustration of formation of a dielectric region 120 on semiconductor device 100 following deposition of interfacial region 110. Deposition of dielectric region 120 may be performed via any now known or later developed deposition methods as discussed herein.

Figure 4:
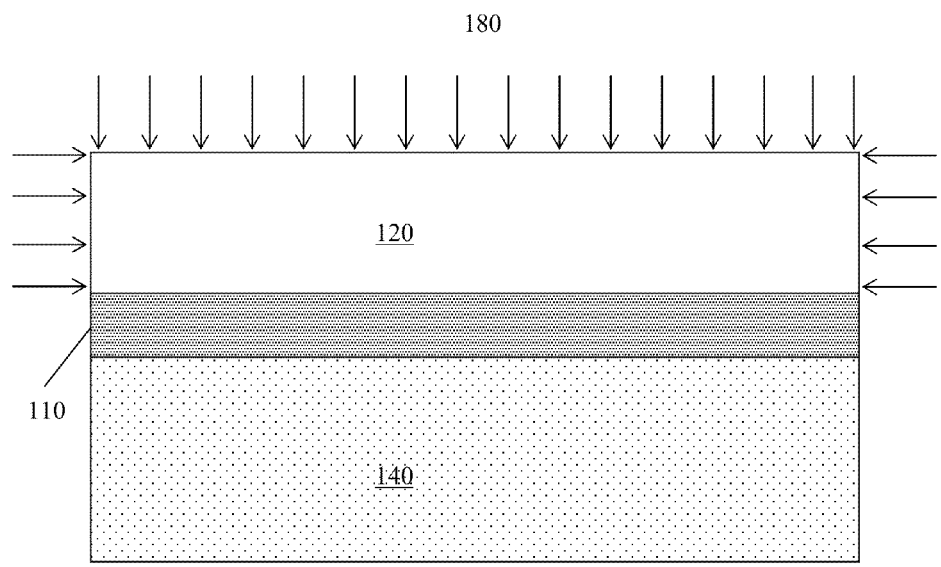

Next, in FIG. 4, a demonstrative illustration of semiconductor device 100 is shown being subjected to thermal $NH_3$ annealing process 180 at a low pressure (e.g., less than about 20 Torr). This annealing process may be performed in conjunction with or separate to a thermal anneal to mature dielectric region 120. Thermal $NH_3$ annealing process 180 may be performed at a low temperature (e.g., less than about 800 degrees Celsius). The nitrogen depth profile in dielectric region 120 may be determined by at least one of, the pressure at which dielectric region 120 is annealed and the concentration of nitrogen (e.g., $NH_3$) present in the annealing process environment.

The nitrogen depth profile of semiconductor device 100 may be monitored during baking to generate a profile engineering record, to enable control and manipulation of the nitrogen depth profile, and for scaling of the EOT of dielectric region 120. This monitoring may be performed in real-time via spectral metrology (e.g., via an X-Ray Photoelectron Spectroscopy (XPS)). XPS may be used to monitor the relation between nitrogen in substrate 140 and nitrogen in dielectric region 120 (e.g., a comparison of SiN and HfN). This monitoring may be used by a technician and/or computing device to adaptively adjust baking conditions (e.g., a pressure of the annealing process, a concentration of nitrogen in the annealing process environment, etc.) to control the nitrogen depth profile of dielectric region 120. By enabling a technician to monitor in real-time the nitrogen profile of dielectric region 120 and adaptively manipulate thermal anneal 180 (e.g., adjusting a pressure and/or nitrogen concentration in the environment) to control or adjust maturation and saturation of components and regions of semiconductor device 100, monitoring of the nitrogen depth profile enables real-time scaling of the EOT of dielectric region 120 and gate 170.

In an embodiment, Secondary Ion Mass Spectrometer (SIMS) analysis may be combined with XPS monitoring to generate a comprehensive real-time material concentration profile of portions of semiconductor device 100 (e.g., substrate 140, dielectric region 120, etc.). SIMS analysis may include use of a supportive data set used to validate/verify the N profile observed through XPS monitoring. In one embodiment, XPS monitoring may be used to control the SiN and HfN amounts in semiconductor device 100. In one embodiment, XPS monitoring may be inline.

In an embodiment, the total peak intensity of N1s spectra observed through XPS monitoring is corresponded to the N concentration/quantity in the film. This N concentration may be decoupled into 2 portions by proper peak fitting. In one embodiment, the higher binding energy part is due to the Si—N bond, in $HfO_2$/SiON system of semiconductor device 100, which indicates the quantity/concentration of N in interfacial layer 110. A lower binding energy peak may represent the Hf—N bond, indicating an amount of N in $HfO_2$ of semiconductor device 100. An N profile of semiconductor device 100 may be determined by XPS monitoring and determination of these 2 peaks, indicating how much N is in interfacial layer 110 and $HfO_2$ after the nitridation process. In one embodiment, a layer of $HfO_2$ on semiconductor device 100 may have a thickness of less than about 30 angstroms.

Figure 5:
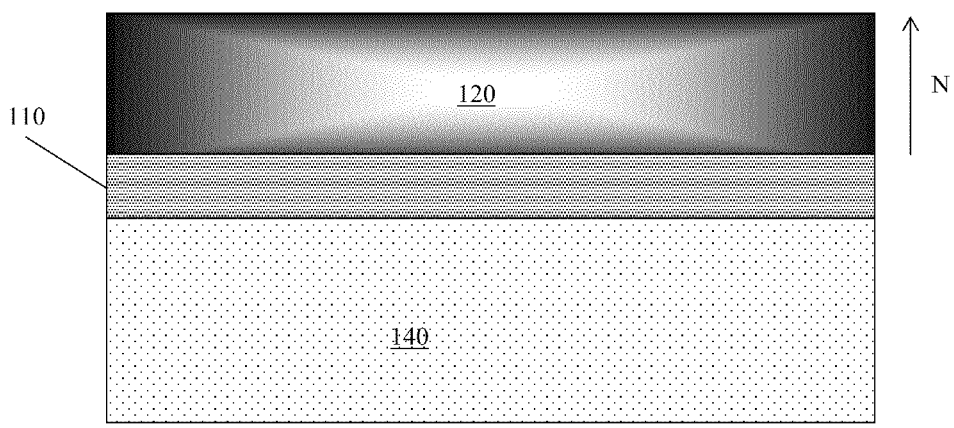

Following $NH_3$ thermal annealing process 180, as shown in the demonstrative illustration of FIG. 5, semiconductor device 100 may be formed with a controlled material concentration profile 'N' and a scaled EOT. Controlled material concentration profile 'N' formed by the $NH_3$ thermal anneal 180 described herein includes a material composition which meets design specifications. It is understood that the use of an $NH_3$ thermal anneal process as described herein, as part of a nitridation process, is for illustrative purposes, and that any like treatments, chemicals, elements and formulas may be used in accordance with this invention.

Figure 6:
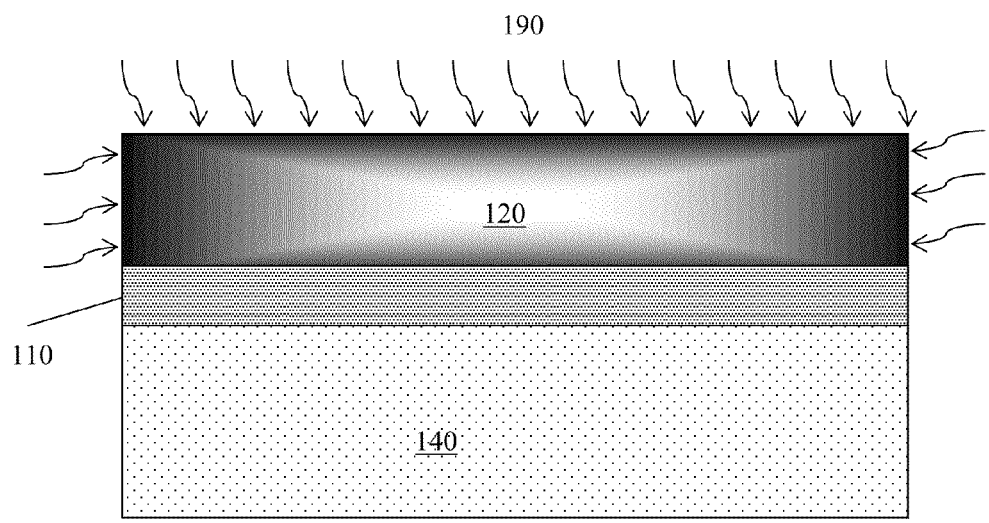

Turning to FIG. 6, a demonstrative illustration of an optional annealing process 190 for semiconductor device 100 is shown according to an embodiment of the invention. Optional annealing process 190 may further define and/or adjust controlled material concentration profile N. In one embodiment, optional annealing process 190 may be performed at a pressure less than about 20 Torr and at a temperature less than about 850 degrees Celsius. Optional annealing process 190 may further stabilize regions of semiconductor device 100 and may include use of an inert gas (e.g., $N_2$, Ar, etc.). During optional annealing process 190 a temperature and/or pressure may be varied in accordance with design constraints.

Figure 7:
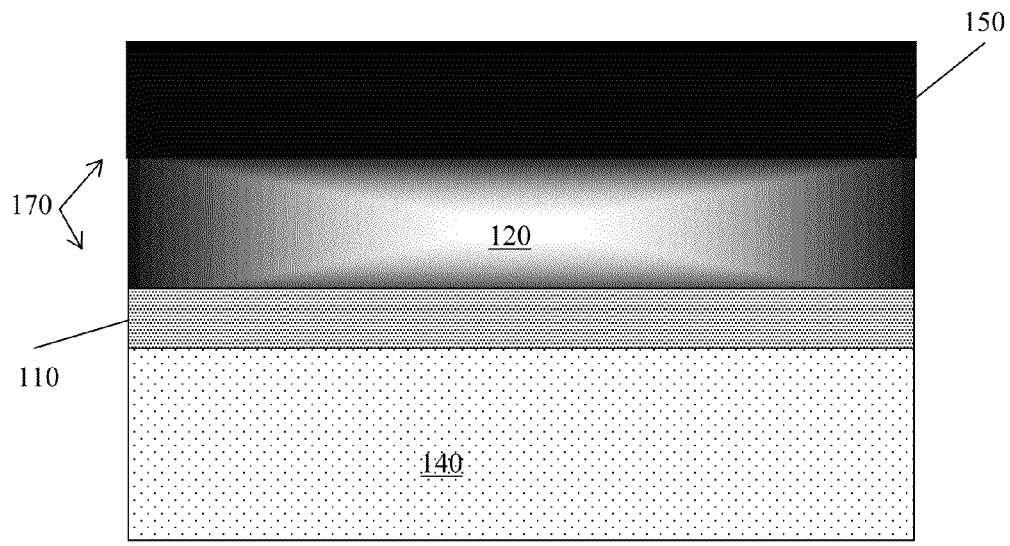

Following either of $NH_3$ thermal anneal process 180 or optional annealing process 190, as shown in the demonstrative illustration of FIG. 7, an electrode region 150 may be deposited on semiconductor device 100 to form gate 170. It is understood that the $NH_3$ thermal anneal 180 described herein may be combined with any number of annealing processes, anneals, or other sets of environmental conditions and chemicals as are known or later developed.

Figure 8:
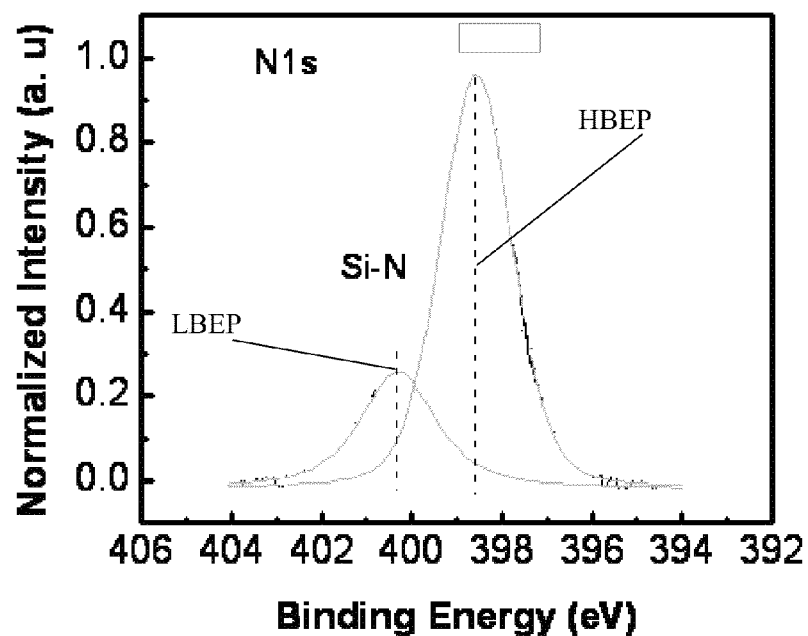
FIG. 8 is a demonstrative illustration of a graphical representation of a profile of portions of a semiconductor device according to an embodiment of the invention.
Figure 9:
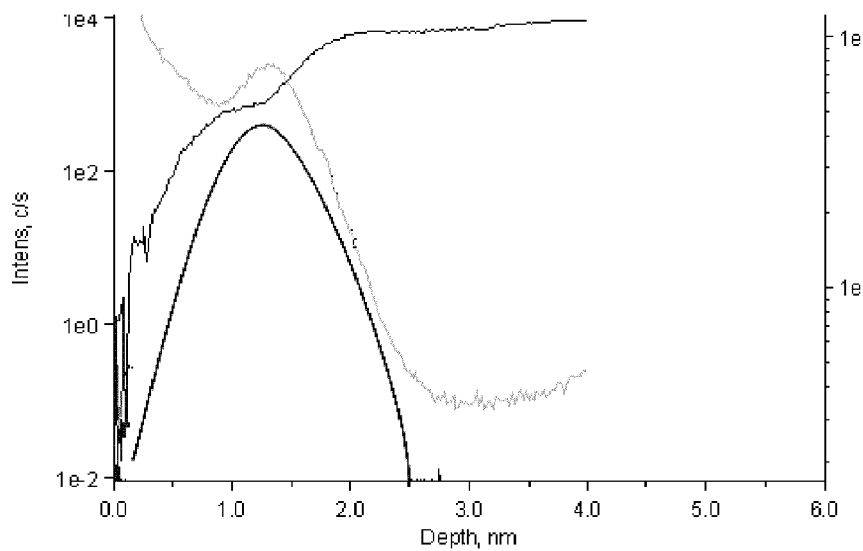
FIG. 9 is a demonstrative illustration of a graphical representation of a profile of portions of a semiconductor device according to an embodiment of the invention.
Figure 10:
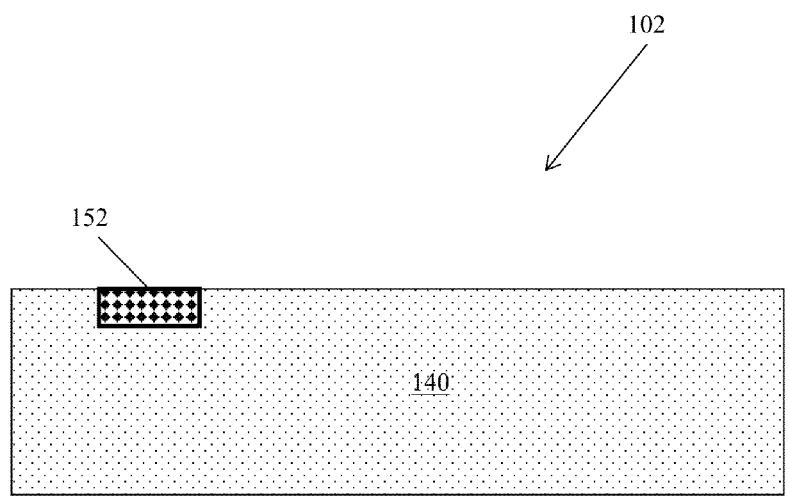
FIGS. 10-15 are demonstrative illustrations of a method of forming a semiconductor device according to embodiments of the invention.
Figure 11:
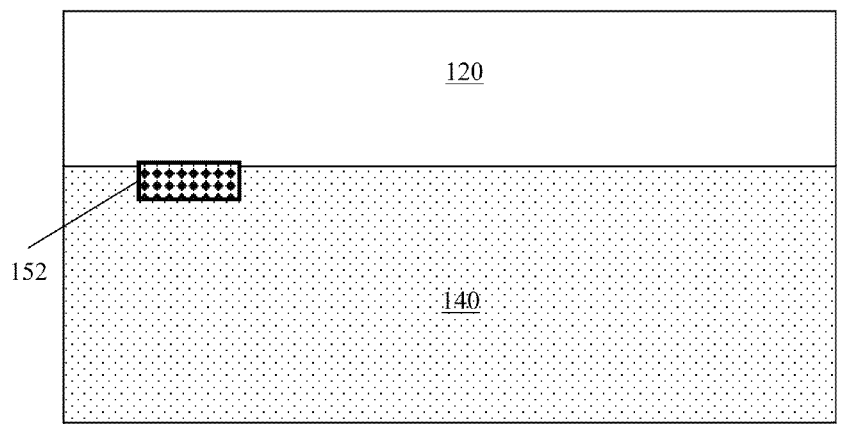

Turning to FIG. 8, a demonstrative illustration of a graphical representation of nitrogen profile monitoring during $NH_3$ thermal anneal 180 is shown through N1s spectra according to embodiments. In this embodiment, nitrogen intensity (e.g., normalized intensity) is shown relative to Binding Energy (eV). In one embodiment, a technician or computing device may monitor the nitrogen peak in dielectric region 120, interfacial region 110, substrate 140 and/or semiconductor device 100 during the $NH_3$ thermal anneal 180 in order to monitor the annealing process and scale the EOT of dielectric region 120. As the total peak intensity of N1s spectra corresponds to the nitrogen quantity in the film, the technician or computing device may separably monitor different portions of semiconductor device 100 by proper peak fitting. For example, with a dielectric region 120 including Hafnium (Hf), the nitrogen amount in dielectric region 120 may be determined by monitoring a higher binding energy peak (HBEP) which is related to the Si—N bond in the $HfO_2$/SiON region(s). The nitrogen amount in a $HfO_2$ region may be determined by monitoring the lower binding energy peak (LBEP) which is related to the Hf—N bond. From these determinations, the nitrogen profile of semiconductor device 100 may be determined in real time. HBEP and LBEP may represent the amount of N in interfacial region 110 and dielectric region 120, and how much nitrogen is in the $HfO_2$ after the nitridation process. In FIG. 9, a demonstrative illustration of a graphical representation of nitrogen profile monitoring during a $NH_3$ thermal anneal 180 is shown via N1s spectra according to embodiments. In this embodiment, an intensity of nitrogen profiles in the regions of semiconductor device 100 is shown relative to a depth (nm) in each respective region. As can be seen, an intensity of nitrogen may vary relative to the depth of each region.

FIGS. 10-15 are demonstrative illustrations of a device undergoing processes in a method according to embodiments. Although FIGS. 10-15 show the method of forming portions of a semiconductor device 102 shown in FIG. 15, it is understood that a similar method may be employed to form any other like semiconductor device.

Returning to FIG. 10, a demonstrative illustration of a cross-sectional view of semiconductor device 102 undergoing a process according to embodiments is shown. In this embodiment, a trench 152 may be etched into substrate 140. Trench 152 may be etched using any now known or later developed etching techniques. In one embodiment, etching of substrate 140 may be performed using a reactive ion etch (RIE). As is known in the art of semiconductor fabrication, RIE uses chemically reactive plasma to remove material deposited on wafers/substrates. Differences in width between these openings may allow for utilizing a phenomenon known as inverse RIE lag. Inverse RIE lag, as is known in the art of semiconductor fabrication, causes a faster etch rate in narrower openings (higher aspect ratios) than in openings having larger widths (lower aspect ratios). Inverse RIE lag may be induced under any conditions characterized by high polymerization and high wafer self-bias voltages. In one embodiment, conditions characterized by high polymerization, may include general chemistries such as CxHyFz (Carbon-Hydrogen-Flourine) with high oxide-to-nitride selectivity (where the blanket etch rate ratio is greater than approximately 20:1). In another embodiment, conditions characterized by high polymerization may include O2 (oxygen), a dilutant, and one or more of: C4F6, C5F8, or C4F8. In this case, the dilutant may be, for example, Argon (Ar). High wafer self-bias voltages may, for example, be voltages greater than approximately 500 volts. While specific conditions for facilitating inverse RIE lag are described herein, those conditions are merely illustrative. Inverse RIE lag may be induced under other conditions not specifically described herein. Next, as shown in the demonstrative illustration of FIG. 11, dielectric region 120 may be formed directly over trench 152 and on substrate 140 of semiconductor device 102 via deposition techniques now known, later developed or discussed herein.

Figure 12:
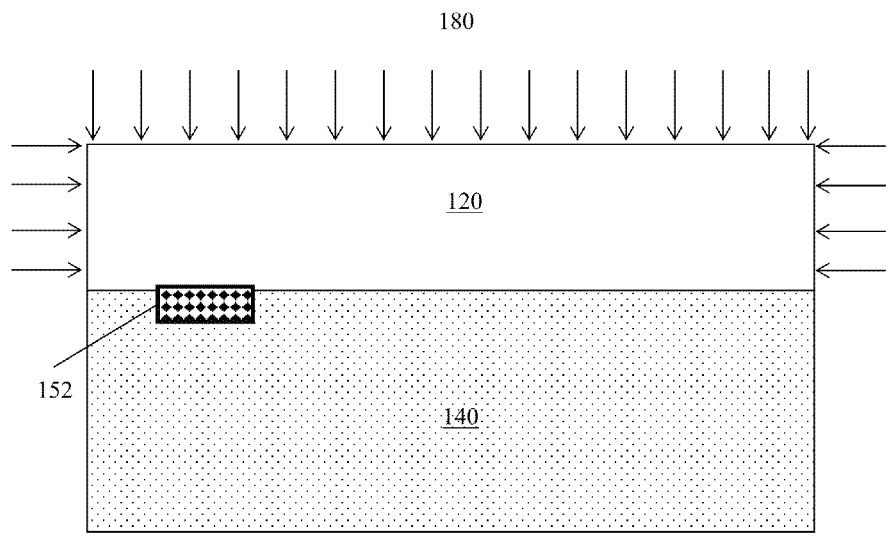

Turning to FIG. 12, a demonstrative illustration of semiconductor device 102 is shown being subjected to a $NH_3$ thermal anneal 180 at a low pressure (e.g., less than about 20 Torr). Thermal anneal 180 may be in conjunction with or separate to an annealing process/thermal anneal to mature dielectric region 120. The nitrogen depth profile in dielectric region 120 may be determined by at least one of: the pressure of thermal anneal 180 and the concentration of nitrogen (e.g., $NH_3$) in the environment of thermal anneal 180.

The nitrogen depth profile of semiconductor device 102 may be monitored during baking to generate a profile engineering record, to enable control and manipulation of the nitrogen depth profile, and for scaling of the EOT of dielectric region 120. This monitoring may be performed in real-time and the nitrogen depth profile may be monitored via spectral metrology (e.g., via a X-Ray Photoelectron Spectroscopy (XPS)). XPS may be used to monitor the relation between nitrogen in substrate 140 and nitrogen in dielectric region 120 (e.g., a comparison of SiN and HfN). This monitoring may be used by a technician and/or computing device to adaptively adjust baking conditions (e.g., a pressure of the annealing process, a concentration of nitrogen in the annealing process, etc.) to manipulate the development of the nitrogen depth profile of portions of semiconductor device 102 (e.g., dielectric region 120, substrate 140). By enabling a technician to monitor in real-time the nitrogen profile of semiconductor device 102 and take steps (e.g., adjusting a pressure and/or nitrogen concentration in the environment) to control or adjust maturation and saturation of components and regions of semiconductor device 102, monitoring of the nitrogen depth profile enables real-time scaling of the EOT of dielectric region 120 and gate 170. In one embodiment, Secondary Ion Mass Spectrometer (SIMS) analysis may be combined with XPS monitoring to generate a comprehensive real-time material concentration profile of semiconductor device 102 and/or dielectric region 120. In one embodiment, XPS monitoring may be used to control the SiN and HfN amounts in semiconductor device 102.

Figure 13:
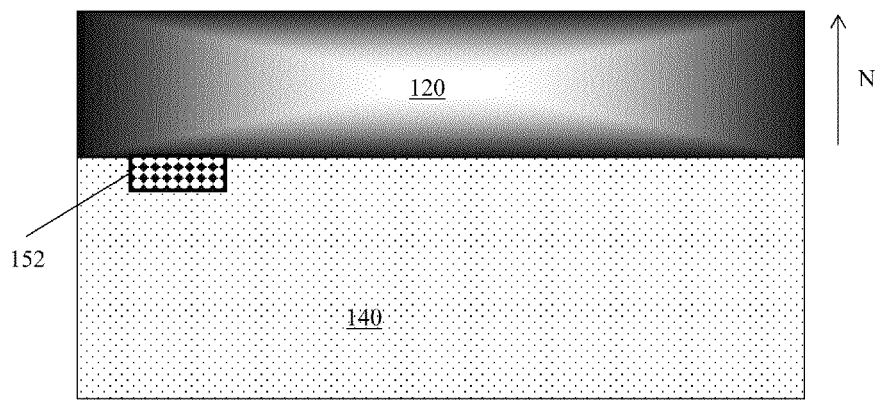

Following $NH_3$ thermal anneal 180, as shown in the demonstrative illustration of FIG. 13, semiconductor device 102 is formed with a designed material concentration profile N and a scaled EOT. This designed material concentration profile formed by $NH_3$ thermal anneal 180 described herein includes a material composition as required by design specifications.

Figure 14:
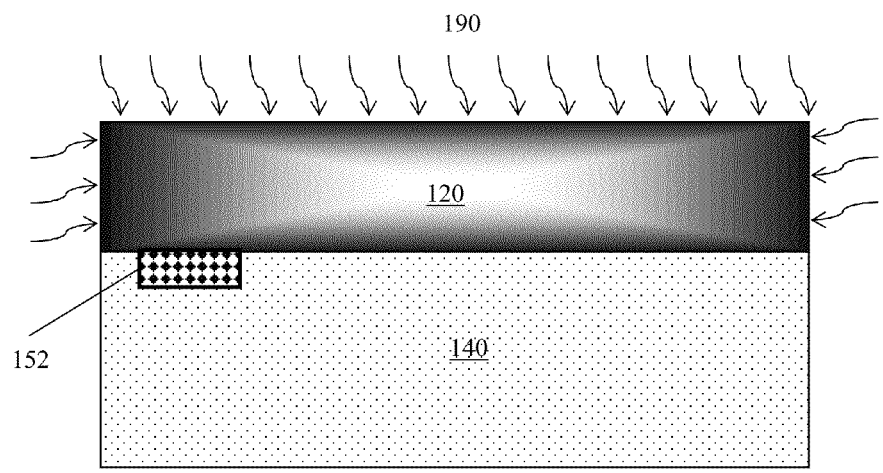
Figure 15:
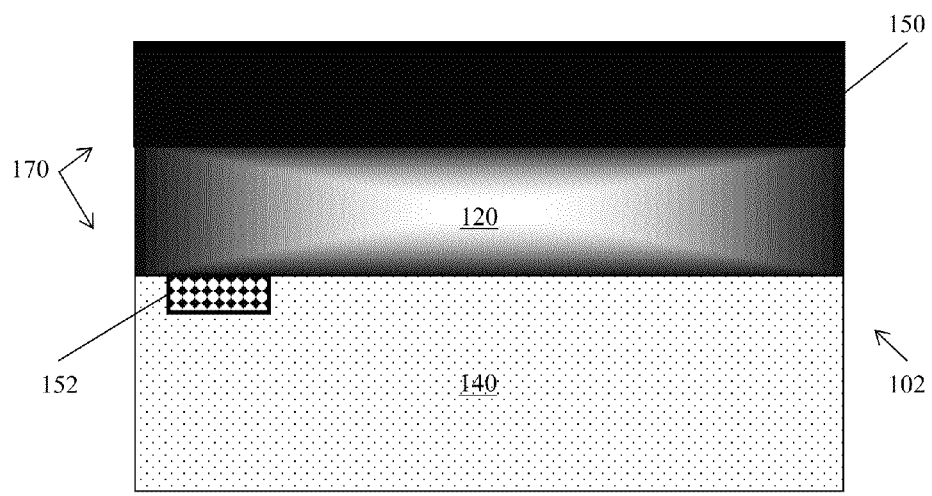

Turning to FIG. 14, a demonstrative illustration of semiconductor device 102 is shown according to an embodiment of the invention undergoing an optional annealing process 190. Optional annealing process 190 may further define and/or engineer material profile N. Following either of $NH_3$ thermal anneal process 180 or optional annealing process 190, as shown in the demonstrative illustration of FIG. 15, an electrode region 150 is deposited on semiconductor device 102 to form gate 170.

Figure 16:
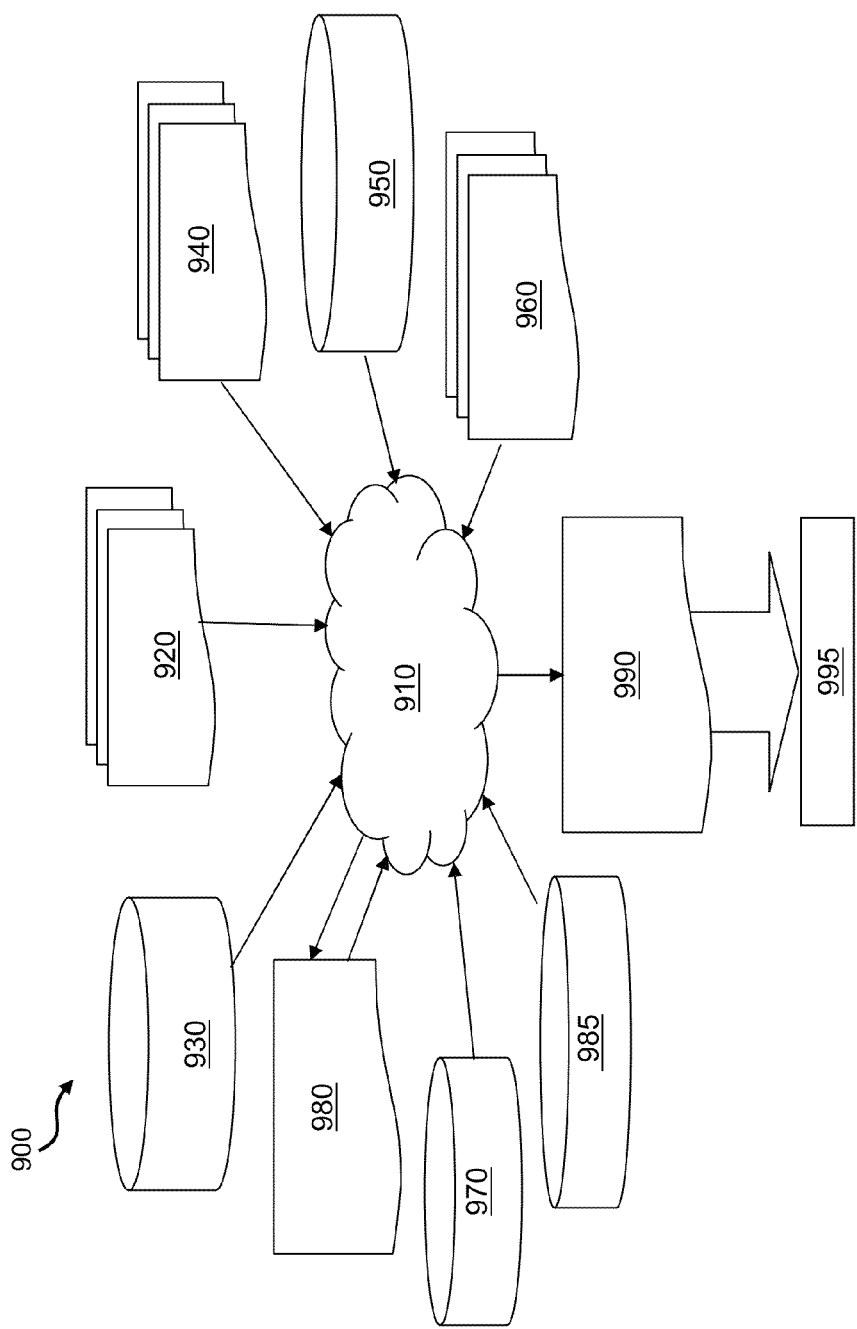
FIG. 16 is a demonstrative illustration of a flow diagram of a design process used in semiconductor design, manufacture, and/or test according to embodiments of the invention.

FIG. 16 shows a demonstrative illustration of a flow diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIG. 1. The design structures processed and/or generated by design flow 900 may be encoded on machine-readable transmission or storage media to include data and/or instructions that when executed or otherwise processed on a data processing system generate a logically, graphically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA).

FIG. 16 illustrates multiple such design structures (e.g., textual representations, graphical representations, data structural representations, etc.) including an input design structure 920 that is preferably processed by a design process 910. Design structure 920 may be a logical simulation design structure generated and processed by design process 910 to produce a logically equivalent functional representation of a hardware device, and may include a text or a graphical representation. Design structure 920 may include at least one of a textual representation, a graphical representation, and a data structural representation of an integrated circuit and/or components thereof. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIG. 1. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIG. 1 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit or semiconductor design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 1. In one embodiment, design structure 990 may comprise a compiled, executable HDL simulation model that functionally simulates the devices shown in FIG. 1.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 1. Design structure 990 may then proceed to a stage 995 where, for example, design structure 990: proceeds to tape-out, is released to manufacturing, is released to a mask house, is sent to another design house, is sent back to the customer, etc.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the regions thereon) to be etched or otherwise processed.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While various embodiments are described herein, it will be appreciated from the specification that various combinations of elements, variations or improvements therein may be made by those skilled in the art, and are within the scope of the invention. In addition, many modifications may be made to adapt a particular situation or material to the teachings of the invention without departing from essential scope thereof.

Therefore, it is intended that the invention not be limited to the particular embodiment disclosed as the best mode contemplated for carrying out this invention, but that the invention will include all embodiments falling within the scope of the appended claims.

What is claimed is:

1. A method of forming a semiconductor device, the method comprising:
    forming a dielectric region on a substrate;
    annealing the dielectric region in an environment including ammonia ($NH_3$);
    monitoring a nitrogen peak of at least one of the substrate and the dielectric region during the annealing; and
    adjusting a parameter of the environment based on the monitoring of the nitrogen peak.

2. The method of claim 1, wherein the annealing is performed at a pressure less than about 20 Torr.

3. The method of claim 2, wherein the annealing is performed at a pressure less than about 10 Torr.

4. The method of claim 1, further comprising monitoring a nitrogen (N) depth profile of at least one of the substrate and the dielectric region.

5. The method of claim 4, wherein the monitoring the N depth profile includes using an X-ray Photoelectron Spectroscopy (XPS) to measure N concentration along a depth of the substrate or the dielectric region.

6. The method of claim 1, wherein the monitoring the nitrogen peak includes determining a relation between amounts of silicon nitride (SiN) and hafnium nitride (HfN) in the semiconductor device.

7. The method of claim 1, wherein the adjusting the parameter of the environment includes adjusting a pressure in the environment during the annealing.

8. The method of claim 1, wherein the adjusting the parameter of the environment includes adjusting a concentration of $NH_3$ in the environment during the annealing.

9. The method of claim 1, further comprising forming an interfacial region on the substrate, the interfacial region configured to be disposed between the substrate and the dielectric region.

10. The method of claim 1, wherein the dielectric region includes a high dielectric constant (high-K) dielectric region.

11. A method of forming a semiconductor device, the method comprising:
    annealing a substrate and a high-K dielectric region in an environment including ammonia ($NH_3$);
    monitoring a nitrogen (N) profile in at least one of the substrate and the high-K dielectric during the annealing; and
    adjusting a parameter of the environment based on the monitoring of the N profile.

12. The method of claim 11, wherein the annealing process is performed at a pressure less than about 20 Torr and the dielectric region includes a high dielectric constant (high-K) dielectric region.

13. The method of claim 11, wherein the monitoring is performed via an X-ray Photoelectron Spectroscopy (XPS) configured to determine a nitrogen (N) depth profile of at least one of the substrate and the dielectric region.

14. The method of claim 11, wherein the monitoring the nitrogen profile includes determining a relation between amounts of silicon nitride (SiN) and hafnium nitride (HfN) in the semiconductor device.

15. The method of claim 11, wherein the adjusting the parameter of the environment includes manipulating at least one of a pressure in the environment, a temperature in the environment, and a concentration of $NH_3$ in the environment.

* * * * *